(12) United States Patent
Bletsos et al.

(10) Patent No.: US 8,404,330 B2
(45) Date of Patent: Mar. 26, 2013

(54) BREATHABLE LOW-EMISSIVITY METALLIZED SHEETS

(75) Inventors: Ioannis V. Bletsos, Midlothian, VA (US); Peter Francis Carcia, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1358 days.

(21) Appl. No.: 11/647,066

(22) Filed: Dec. 28, 2006

(65) Prior Publication Data

US 2010/0247855 A1     Sep. 30, 2010

Related U.S. Application Data

(63) Continuation-in-part of application No. 10/924,218, filed on Aug. 23, 2004, now abandoned.

(51) Int. Cl.
*B32B 3/24* (2006.01)
(52) U.S. Cl. ............ 428/137; 428/596; 442/77; 442/76; 442/230; 442/379
(58) Field of Classification Search .................. 428/137, 428/596; 442/76, 77, 230, 379
See application file for complete search history.

(56) References Cited

U.S. PATENT DOCUMENTS

| | | | |
|---|---|---|---|
| 3,081,519 A | | 3/1963 | Blades et al. |
| 3,169,899 A | | 2/1965 | Steuber |
| 3,227,784 A | | 1/1966 | Blades et al. |
| 3,851,023 A | | 11/1974 | Brethauer et al. |
| 4,508,776 A | * | 4/1985 | Smith ............................ 442/230 |
| 4,739,012 A | | 4/1988 | Hagman |
| 4,866,062 A | | 9/1989 | Toth et al. |
| 4,911,811 A | * | 3/1990 | Mullaney, Jr. ........... 204/192.14 |
| 4,974,382 A | | 12/1990 | Avellanet |
| 4,999,222 A | * | 3/1991 | Jones et al. .................. 427/250 |
| 5,316,837 A | * | 5/1994 | Cohen .......................... 442/230 |
| 5,955,175 A | | 9/1999 | Culler |
| 6,017,981 A | * | 1/2000 | Hugo ............................ 523/216 |
| 6,083,628 A | | 7/2000 | Yializis |
| 7,805,907 B2 | * | 10/2010 | Bletsos et al. ............... 52/741.3 |

FOREIGN PATENT DOCUMENTS

| | | |
|---|---|---|
| EP | 1400348 | 8/2003 |
| WO | WO 98/18852 | 5/1998 |

\* cited by examiner

*Primary Examiner* — William P Watkins, III

(57) ABSTRACT

A durable metallized moisture vapor permeable sheet is formed by coating a moisture vapor permeable sheet with at least one metal coating comprising a layer of a corrosion resistant metal or a plurality of metal layers having differing compositions. The metallized moisture vapor permeable sheet material is suitable for use as a building construction wrap such as roof lining and house wrap, and as EMF radiation shielding material.

14 Claims, 1 Drawing Sheet

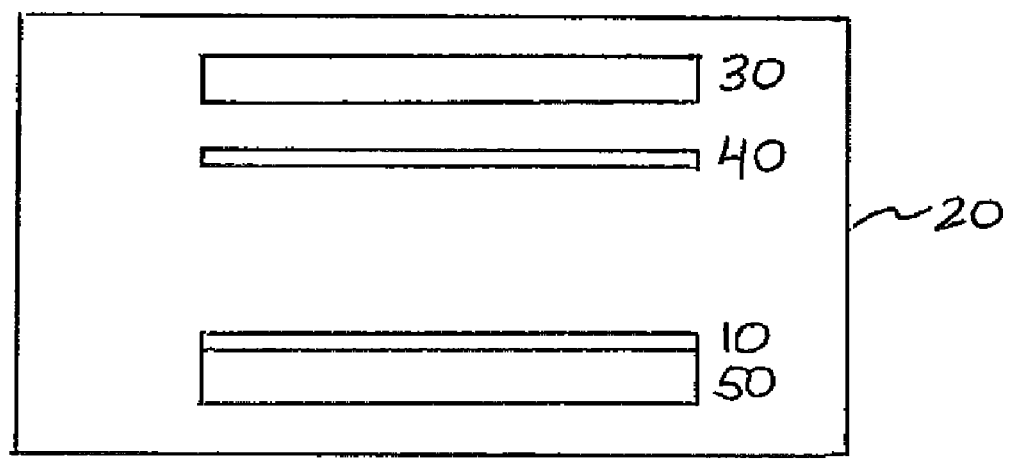

BREATHABLE LOW-EMISSIVITY METALLIZED SHEETS

BACKGROUND OF THE INVENTION

The present invention relates to metallized sheets having improved moisture vapor permeability and thermal barrier properties suitable for use as thermal barriers in building construction.

It is known in the art to use moisture vapor permeable (breathable) metallized sheets as house wrap in building construction. The metallized sheets allow moisture vapor to pass through the sheet, thus preventing moisture condensation in insulation that is installed behind the sheet, while at the same time providing a barrier to air and liquid water and enhancing the energy efficiency of the building. U.S. Pat. No. 4,999,222 to Jones et al. describes moisture vapor permeable metallized polyethylene sheets with low emissivity prepared by calendering a plexifilamentary film-fibril sheet followed by vacuum metallization. U.S. Pat. No. 4,974,382 to Avellanet describes an infiltration and energy barrier that can be vapor permeable or impermeable having at least one metallized layer thereon. Published PCT International Application No. WO 01/28770 to Squires et al. describes breathable building membranes that include an under layer of microporous film and a top layer formed of a filamentous polymeric fabric, For example a spunbond fabric, which is provided with a moisture vapor permeable reflective metal coating. While the breathable metallized sheets described above provide a thermal barrier by reflecting infrared radiation, they are susceptible to oxidation of the metal layer upon exposure to air and moisture. An oxidized metal layer generally has a higher emissivity than the corresponding metal and is less effective as a thermal barrier. Such breathable metallized sheets are also susceptible to corrosion of the metal layer upon exposure to acid rain or corrosive ambient conditions such as salt-laden air in coastal and marine environments. In addition, a thin exposed metal layer can be damaged during processing, installation, etc.

Published European Patent Application No. EP 1400348 to Avril et al. describes liquid impermeable, moisture vapor/gas permeable laminated fabrics that are suitable for use as construction fabrics such as house wrap and roofing underlay that include a reflective film layer formed by vapor depositing a metal layer on a first polymeric film layer and sandwiching the metal layer between the first polymeric film layer and a second polymeric film layer. The film layers protect the metal layer from damage during use, but are moisture impermeable and are microperforated after metallization to provide the desired moisture vapor permeability.

Metallized nonwovens that have been coated with an organic polymer are also known for construction end uses, such as house wrap. However, the polymeric coating is applied using methods that significantly reduce the moisture vapor permeability compared to the uncoated metallized nonwoven sheet. U.S. Patent Application Publication No. 2003/0136078 to Brown et al. describes a method of insulating a building that includes the step of introducing an insulating membrane comprising a reflective layer and a breathable textile layer into the cavity between the outer cladding layer and the frame. The metallized layer may optionally be coated with a protective layer of plastic or varnish to protect the metal surface.

When a moisture vapor permeable sheet is coated over substantially an entire surface using conventional methods such as air knife coating, flexographic printing, gravure coating, etc., the coating reduces the moisture vapor permeability of the sheet. If the starting sheet has an open structure and is highly air permeable, the sheet can retain sufficient moisture vapor permeability after coating to be useful in certain end uses, such as apparel. For example, fabrics described in U.S. Pat. No. 5,955,175 to Culler are both air permeable and moisture vapor permeable after being metallized and coated with an oleophobic coating. However, when the starting moisture vapor permeable sheet has a highly closed structure with very low air permeability, such as nonwoven and other sheets used as house wrap or roof lining in the construction industry, conventional coatings result in significant covering of the pores on the surface of the sheet. This results in a coated sheet having significantly lower moisture vapor permeability than the starting sheet. This is undesirable in house wrap and roof lining products, which are desirably permeable to moisture vapor while at the same time forming a barrier to infiltration by air and liquid water.

It would be desirable to provide metallized sheets that have high barrier to liquid water, high moisture vapor permeability, and good thermal barrier properties for construction uses such as house wrap and roof lining. It would also be desirable to provide metallized sheets having such properties that have improved resistance to corrosion and are sufficiently durable for construction uses. Furthermore, it would be desirable to provide metallized sheets in which no protective outer coating is necessary.

BRIEF SUMMARY OF THE INVENTION

According to a first embodiment, the present invention is a barrier surface in a building construction comprising structural building components and optionally barrier sheathing, a water resistive barrier attached to said building components or to said optional barrier sheathing, comprising a metallized, moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics, having at least one metal coating on said first outer surface of the sheet layer which substantially covers the outer surfaces of the porous sheet while leaving the pores substantially uncovered, said metal coating comprising an alloy selected from the group consisting of aluminum/bronze alloys, manganese/bronze alloys, copper/nickel/zinc alloys, copper/nickel alloys, stainless steel, and aluminum/magnesium alloys, having a thickness between about 15 nanometers and about 200 nanometers adjacent the first outer surface of the sheet layer, and an air space adjacent the water resistive barrier.

In another embodiment, the present invention is directed to a metallized, moisture vapor permeable sheet comprising a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics; and at least one metal coating on said first outer surface of the sheet layer which substantially covers the outer surfaces of the porous sheet while leaving the pores substantially uncovered, said metal coating comprising an alloy selected from the group consisting of aluminum/bronze alloys, manganese/bronze alloys, copper/nickel/zinc alloys, copper/nickel alloys, stainless steel, and aluminum/magnesium alloys, having a thickness between about 15 nanometers and about 200 nanometers adjacent the first outer surface of the sheet layer.

In a further embodiment, the present invention is directed to a barrier surface in a building construction comprising structural building components and optionally barrier sheathing, a water resistive barrier attached to said building components or to said optional barrier sheathing, comprising a metallized, moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics having a metal coating on said first outer surface of the sheet layer, the metal coating comprising two or more different metal layers selected from the group consisting of aluminum, silver, copper, gold, tin, zinc, iron, aluminum/bronze alloys, manganese/bronze alloys, copper/nickel/zinc alloys, copper/nickel alloys, stainless steel, and aluminum/magnesium alloys, the metal coating having a thickness between about 15 nanometers and 200 nanometers adjacent the first outer surface of the sheet layer; and an air space adjacent the water resistive barrier.

In a further embodiment, the present invention is directed to a metallized, moisture vapor permeable sheet comprising a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics, and a metal coating on said first outer surface of the sheet layer, the metal coating comprising two or more different metal layers selected from the group consisting of aluminum, silver, copper, gold, tin, zinc, iron, aluminum/bronze alloys, manganese/bronze alloys, copper/nickel/zinc alloys, copper/nickel alloys, stainless steel, and aluminum/magnesium alloys, the metal coating having a thickness between about 15 nanometers and 200 nanometers adjacent the first outer surface of the sheet layer.

BRIEF DESCRIPTION OF THE DRAWING

FIG. 1 is a schematic diagram of an apparatus suitable for forming a composite sheet of the present invention.

DETAILED DESCRIPTION OF THE INVENTION

The terms "nonwoven fabric", "nonwoven sheet", "nonwoven layer", and "nonwoven web" as used herein refer to a structure of individual strands (e.g. fibers, filaments, or threads) that are positioned in a random manner to form a planar material without an identifiable pattern, as opposed to a knitted or woven fabric. The term "fiber" is used herein to include staple fibers as well as continuous filaments. Examples of nonwoven fabrics include meltblown webs, spunbond nonwoven webs, flash spun webs, staple-based webs including carded and air-laid webs, spunlaced webs, and composite sheets comprising more than one nonwoven web.

The term "woven sheet" is used herein to refer to sheet structures formed by weaving a pattern of intersecting warp and weft strands.

The term "spunbond fibers" as used herein means fibers that are melt-spun by extruding molten thermoplastic polymer material as fibers from a plurality of fine, usually circular, capillaries of a spinneret with the diameter of the extruded fibers then being rapidly reduced by drawing and then quenching the fibers.

The term "meltblown fibers" as used herein, means fibers that are melt-spun by meltblowing, which comprises extruding a melt-processable polymer through a plurality of capillaries as molten streams into a high velocity gas (e.g. air) stream.

The term "spunbond-meltblown-spunbond nonwoven fabric" ("SMS") as used herein refers to a multi-layer composite sheet comprising a web of meltblown fibers sandwiched between and bonded to two spunbond layers. Additional spunbond and/or meltblown layers can be incorporated in the composite sheet, for example spunbond-meltblown-meltblown-spunbond webs ("SMMS"), etc.

The term "plexifilamentary" as used herein, means a three-dimensional integral network or web of a multitude of thin, ribbon-like, film-fibril elements of random length and with a mean film thickness of less than about 4 microns and a median fibril width of less than about 25 microns. In plexifilamentary structures, the film-fibril elements are generally coextensively aligned with the longitudinal axis of the structure and they intermittently unite and separate at irregular intervals in various places throughout the length, width and thickness of the structure to form a continuous three-dimensional network. A nonwoven web of plexifilamentary film-fibril elements is referred to herein as a "flash spun plexifilamentary sheet".

As used herein, the term "tape" refers to a flattened strand, such as flattened strands formed from a slit film.

As used herein, the term "metal" includes metal alloys as well as metals.

The term "barrier surface in a building construction" is used herein to refer to surfaces within a building which separate the interior living space from the outside, or the remainder of the structure, including wall systems and roof systems.

The term "wall system" is used herein to refer a wall in a building construction. A wall system includes internal lining and outer skin layers, and other wall elements intermediate the internal lining and outer skin layers. The intermediate elements can include supporting frame elements such as vertical wooden studs, at least one air space, insulation material, optional vapor barrier layer, and a metallized moisture vapor permeable sheet of the present invention.

The term "roof system" is used herein to refer to a roof in a building construction. A roof system includes supporting roof frame elements such as pitched wooden rafters, external roofing material and other roof elements. Roof systems can be classified as warm roof systems and cold roof systems. In a cold roof system, the other roof elements can include optional vapor barrier layer, at least one air space (which can be the attic air space), elements intermediate the supporting roof frame elements and the external roofing material such as battens or solid sheathing, a metallized moisture vapor permeable sheet of the present invention, and insulation material installed at the floor level of the attic space (e.g. on the ceiling joists), above the interior ceiling level. In a warm roof system, the other roof elements can include, in addition to those listed for a cold roof system, an attic ceiling and insulation installed above the attic ceiling (instead of at the floor level of the attic space). The other roof elements can be intermediate the supporting roof frame elements and the external roofing material, or attached to the side of the supporting roof frame elements facing towards the attic space, or installed between adjacent roof frame elements, etc., depending on the specific roof element.

In one embodiment, the present invention relates to metallized moisture vapor permeable sheets formed by coating at least one side of a moisture vapor permeable sheet layer with at least one layer thereon of a corrosion-resistant metal alloy (also referred to as the "metal layer" or the "metal coating"). The metallized moisture vapor permeable sheets have high moisture vapor permeability, and good thermal barrier properties. The metallized moisture vapor permeable sheets can also be selected to provide a high barrier to intrusion by liquid water (high hydrostatic head), which is also important in construction end uses such as house wrap and roof lining. The balance of properties provided by the metallized moisture vapor permeable sheets of the present invention is superior to currently available metallized sheets used in the construction industry. The metallized moisture vapor permeable sheets of the present invention provide thin, strong, breathable air and thermal barriers that are suitable for use in existing or new construction. The metallized moisture vapor permeable sheets of the present invention, when used as a thermal barrier in wall and/or roof systems, are beneficial in meeting building regulations requiring higher energy efficiency for new construction and renovated buildings.

The metallized moisture vapor permeable sheet of the invention can optionally include at least one thin organic coating layer on the metal layer opposite the sheet layer to protect the metal layer from damage during handling, and/or an intermediate organic coating layer formed on the moisture vapor permeable sheet layer between the sheet layer and the metal layer. The organic coating layers are preferably formed under vacuum using vapor deposition techniques under conditions that substantially coat the sheet layer without significantly reducing its moisture vapor permeability. The metallized moisture vapor permeable sheets of the present invention include the following structures: Sheet/L1/M, Sheet/M/L2, Sheet/L1/M/L2, and Sheet/L1/M/L2/M/L3, etc. where Sheet is a moisture vapor permeable sheet layer, M is a low emissivity metal alloy layer and L1, L2, and L3 are organic coating layers comprising an organic polymer or organic oligomer, or blends thereof. The abbreviation "L1" is used herein to refer to an optional intermediate organic coating layer that is deposited on a surface of the sheet layer prior to depositing the metal layer thereon. The intermediate coating layer has been found to improve the thermal barrier properties of the metallized moisture vapor permeable sheet compared to metallized moisture vapor permeable sheets that do not include an intermediate coating layer. The metallized moisture vapor permeable sheets optionally include at least one outer organic coating layer overlying the alloy layer such as L2 and L3 in the above-described structures.

The sheet layer can be coated on one side, as in the structures described above, or on both sides of the moisture vapor permeable sheet such as in the following structures: M/Sheet/M/L2, M/L1/Sheet/L1/M, L2/M/L1/Sheet/L1/M/L2, etc.

In one embodiment of the present invention, one or both sides of the moisture vapor permeable sheet layer comprise a porous outer surface, such as a fibrous surface or a porous film that is coated with the metal layer(s) and optional organic layer(s). The organic and metal layers are deposited on the porous surface such that only the exposed or "outer" surfaces of the fibers or film on the coated side(s) are coated, without covering the pores. This includes the internal surfaces of the walls of the interstitial spaces or pores between the fibers, as well as the fiber surfaces that are exposed when viewed from the outer surface of the sheet layer on the coated side(s); but the surfaces of fibers in the interior structure of the fabric remain uncoated.

Moisture vapor permeable sheet layers suitable for forming the composite sheets of the present invention can have a relatively low air permeability, such as between about 5 and about 12,000 Gurley seconds, even between about 20 and about 12,000 Gurley seconds, even between about 100 and about 12,000 Gurley seconds, and even between about 400 and about 12,000 Gurley seconds, which is generally considered to provide a barrier to air infiltration. Alternately, the moisture vapor permeable sheet layer can be selected to have a relatively high air permeability, for example those sheets having a Gurley Hill air permeability of less than 5 seconds, with the air permeability falling in the Frazier air permeability range. A moisture vapor permeable sheet with a relatively high air permeability can have a moisture vapor permeability of at least about 35 g/m$^2$/24 hours, even at least about 200 g/m$^2$/24 hours, even at least about 600 g/m$^2$/24 hours, and a hydrostatic head of at least about 20 cm $H_2O$, even at least about 50 cm $H_2O$, even at least about 100 cm $H_2O$, and even at least about 130 cm $H_2O$. When used as a house wrap, the moisture vapor permeable sheet preferably has a tensile strength of at least about 35 N/cm.

Suitable moisture vapor permeable sheet layers are porous sheets, which include woven fabrics, such as sheets of woven fibers or tapes, or nonwoven fabrics, such as flash-spun plexifilamentary sheets, spunbond nonwoven sheets, spunbond-meltblown nonwoven sheets, spunbond-meltblown-spunbond nonwoven sheets, and laminates that include a nonwoven or woven fabric or scrim layer and a moisture vapor permeable film layer, such as a microporous film, a microperforated film or a moisture vapor permeable monolithic film. The starting sheet layer can comprise a moisture vapor permeable sheet that has been coated using conventional coating methods. For example, sheets currently used in the construction industry include sheets of woven tapes that have been coated with a polymeric film layer and microperforated. The sheet layer may be formed from a variety of polymeric compositions. For example, sheets used in the construction industry are typically formed from polyolefins such as polypropylene or high density polyethylene, polyesters, or polyamides.

In one embodiment, the moisture vapor permeable sheet is a flash spun plexifilamentary polyolefin sheet such as Tyvek® flash spun high density polyethylene, available from E.I. du Pont de Nemours and Company, Inc. (Wilmington, Del.). Suitable flash spun plexifilamentary film-fibril materials may also be made from polypropylene. The moisture vapor permeable sheet can be a laminate of a flash spun plexifilamentary sheet with one or more additional layers, such as a laminate comprising a flash spun plexifilamentary sheet and a melt-spun spunbond sheet. Flash spinning processes for forming web layers of plexifilamentary film-fibril strand material are disclosed in U.S. Pat. Nos. 3,081,519 (Blades et al.), 3,169,899 (Steuber), 3,227,784 (Blades et al.), 3,851,023 (Brethauer et al.), the contents of which are hereby incorporated by reference.

The moisture vapor permeable sheet can be a commercially available house wrap or roof lining product. Flash-spun plexifilamentary sheets used in building construction include Tyvek® SUPRO roof lining, Tyvek® HomeWrap®, Tyvek® CommercialWrap®. Other house wrap products suitable as the moisture vapor permeable sheet layer include Air-Guard® Buildingwrap (manufactured by Fabrene, Inc., North Bay, Ontario) which is a woven fabric of high density polyethylene slit film that is coated with white pigmented polyethylene on one side and perforated, Pinkwrap® Housewrap (manufactured by Owens Corning, Toledo, Ohio) which is a woven fabric of polypropylene slit film that is coated on one side and perforated, Pinkwrap Plus® Housewrap (manufactured by Owens Corning, Toledo, Ohio) which is a cross-ply laminated polyolefin film that is micropunctured and has a corrugated surface, Tuff Wrap® Housewrap (manufactured by Cellotex Corporation, Tampa, Fla.) which is a woven fabric of high density polyethylene film that is coated on one side and perforated, Tuff Weather Wrap® (manufactured by Cellotex Corporation, Tampa, Fla.) which is a polyolefin sheet bonded to a nonwoven scrim that has been embossed to create small dimples on the surface, Greenguard Ultra Amowrap® (manufactured by Amoco, Smyrna, Ga.) which is a woven fabric of polypropylene slit film that is coated on one side and perforated, Weathermate® Plus Housewrap (manufactured by Dow Chemical Company, Midland, Mich.) which is a non-perforated nonwoven membrane that has been coated with a clear coating, and Typar® Housewrap (manufactured by Reemay, Old Hickory, Tenn.) which is a coated spunbond polypropylene sheet.

In some cases it may be desirable to use a moisture vapor permeable sheet layer that is substantially air impermeable. For example, the moisture vapor permeable sheet layer can comprise a laminate of a nonwoven or woven fabric or scrim and a moisture vapor permeable film layer, wherein the moisture vapor permeable film layer is a microporous film or a monolithic film. Generally, one or more moisture vapor permeable film layers are sandwiched between outer porous nonwoven or woven fabric or scrim layers and the metal and organic coating layers are deposited on at least one of the porous outer layers such that an outer organic coating layer forms an outside surface of the composite sheet. In one such embodiment, a moisture vapor permeable film layer is sandwiched between two staple fiber nonwoven layers, or two continuous filament nonwoven layers, or two woven fabrics. The outer fabric or scrim layers can be the same or different.

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven or woven substrate layer using conventional extrusion coating methods. Preferably, the monolithic film is no greater than about 3 mil (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven or woven substrate layer can be introduced into the nip on the side of the film opposite the first substrate to form a moisture vapor permeable, substantially air impermeable laminate wherein the monolithic film is sandwiched between the two substrate layers.

Polymeric materials suitable for forming moisture vapor permeable monolithic films include block polyether copolymers such as a block polyether ester copolymers, polyetheramide copolymers, polyurethane copolymers, poly(etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by E.I. du Pont de Nemours and Company (Wilmington, Del.), and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B.F. Goodrich Company of Cleveland, Ohio, USA. Suitable copoly(etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

Microporous films are well known in the art, such as those formed from a mixture of a polyolefin (e.g. polyethylene) and fine particulate fillers, which is melt-extruded, cast or blown into a thin film and stretched, either mono- or bi-axially to form irregularly shaped micropores which extend continuously from the top to the bottom surface of the film. U.S. Pat. No. 5,955,175 discloses microporous films, which have nominal pore sizes of about 0.2 micrometer. Microporous films can be laminated between porous nonwoven or woven layers using methods known in the art such as thermal or adhesive lamination.

Microperforated films are formed by casting or blowing a polymer into a film, followed by mechanically perforating the film, as generally disclosed in European Patent Publication No. EP 1 400 348 A2, which indicates that the microperforations are typically on the order of 0.1 mm to 1.0 mm in diameter.

According to the present invention, the metal and optional organic layers are deposited on a porous sheet using methods that do not substantially reduce the moisture vapor permeability of the sheet. The coatings are deposited over substantially the entire surface of the sheet material while leaving the pore openings of the material substantially uncovered. According to one embodiment of the invention, the moisture vapor permeable sheet layer comprises a fibrous nonwoven or woven fabric. Alternately, the moisture vapor permeable sheet layer can be a fabric-film laminate wherein the fabric comprises an outer surface of the laminate, or the outer surface of the laminate can be a microperforated film. The metal and optional organic layers are deposited on the fabric or microperforated film such that, in the case of a fabric, the exposed surfaces of individual fabric strands on the coated surface of the composite sheet are substantially covered while leaving the interstitial spaces or pores between the strands substantially uncovered by the coating material. By "substantially uncovered" is meant that at least 35% of the interstitial spaces between the fibers are free of coating. In one embodiment, the total combined thickness of the organic coating layers is less than the diameter of the fibers of the nonwoven web. For non-fibrous sheets, at least 35% of the surface pores on the sheet surface are substantially uncovered. This provides a coated composite sheet that has a moisture vapor permeability that is at least about 80%, even at least about 85%, and even at least about 90% of the moisture vapor permeability of the starting sheet material.

When comparing the moisture vapor permeability of a coated sheet to the moisture vapor permeability of the uncoated starting sheet, the starting sheet used as the control should be substantially equivalent to the starting sheet material used to make the specific composite sheet for which the moisture vapor permeability is being compared. For example sheet samples from the same roll, lot, etc. used to make the coated sheet should be used to measure the moisture vapor permeability of the starting sheet. A section of the sheet layer can be masked prior to coating so that the masked section is not coated during the coating process, and measurements made on samples taken from adjacent uncoated and coated portions of the sheet. Alternately, uncoated samples can be taken from the beginning and/or the end of a roll of the sheet layer and compared to coated samples made from the same roll.

Since the coatings are discontinuous over the pores, the moisture vapor permeability is not impacted significantly. Vacuum vapor deposition methods known in the art are preferred for depositing the metal and organic coatings. The thickness of the metal and optional organic coatings are preferably controlled within ranges that provide a metallized moisture vapor permeable sheet having an emissivity no greater about 0.40, even no greater than about 0.3, and even no greater than about 0.25.

The thickness and the composition of the optional outer organic coating layer is selected such that, in addition to not substantially changing the moisture vapor permeability of the sheet layer, it does not significantly increase the emissivity of the metallized substrate. The outer organic coating layer preferably has a thickness between about 0.2 µm and 2.5 µm, which corresponds to between about 0.15 $g/m^2$ to 1.9 $g/m^2$ of the organic coating material. In one embodiment, the outer coating layer has a thickness between about 0.2 µm and 1.0 µm (about 0.15 $g/m^2$ to 0.76 $g/m^2$), or between about 0.2 µm and 0.6 µm (about 0.15 $g/m^2$ to 0.46 $g/m^2$). When an intermediate coating layer is used, the combined thickness of the intermediate and outer organic layers is preferably no greater than about 2.5 µm, even no greater than about 2.0 µm, even no greater than about 1.5 µm so that the pores on the surface of the moisture vapor permeable sheet are substantially uncovered. In one embodiment, the combined thickness of the intermediate and outer organic coating layers is no greater than about 1.0 µm. For the structure Sheet/L1/M/L2, the intermediate coating layer preferably has a thickness between about 0.02 µm and 2 µm, corresponding to between about 0.015 $g/m^2$ and 1.5 $g/m^2$. In one embodiment, the intermediate coating layer has a thickness between about 0.02 µm and 1 µm (0.015 $g/m^2$ and 0.76 $g/m^2$), or between about 0.02 µm and 0.6 µm (0.015 $g/m^2$ and 0.46 $g/m^2$). When additional metal and organic layers are deposited, the thickness of each organic coating layer is adjusted such that the total combined thickness of all the organic coating layers is no greater than about 2.5 µm, or no greater than about 1.0 µm. If the outer organic coating layer is too thin, it may not provide optimal protection of the metal layer from oxidation, resulting in an increase in emissivity of the composite sheet. If the outer organic coating layer is too thick, the emissivity of the composite sheet can increase, resulting in lower thermal barrier properties.

It may be desirable in some cases for the intermediate organic coating layer to be very thin, for example between about 0.02 µm and 0.2 µm (approximately 0.015 $g/m^2$ to 0.15 $g/m^2$). One such Example is when the sheet layer comprises a flash spun plexifilamentary or other nonwoven sheet wherein the plexifilaments or fibers have features on their surface that are on the order of 500 nm or less. This is much finer than the surface "macro-roughness" of the nonwoven sheet, where the macro-roughness features are caused by the fibers themselves (peaks and valleys) and gaps between the fibers. It is important that the macro-roughness of the sheet is not significantly altered by metallization and coating, because doing so results in reducing or blocking of the interstitial spaces between the fibers and a reduction in the moisture vapor permeability of the sheet. A very thin polymer layer will smooth the micro-roughness that exists on the surface of the individual fibers without impacting the macro-roughness of the fibrous sheet. In general, an organic coating L1 that is thicker than the average micro-roughness features of a fiber or other surface will result in smoothing of the fiber surface. This smoothing effect may result in a smoother alloy layer on the individual fiber surfaces, thereby reducing the emissivity of the composite sheet compared to sheets that do not include L1. For example, an intermediate coating layer L1 having a thickness between about 0.025 µm and 0.2 µm is suitable for flash spun polyethylene sheets.

Suitable compositions for the optional organic coating layer(s) include polyacrylate polymers and oligomers. The coating material can be a cross-linked compound or composition. Precursor compounds suitable for preparing the organic coating layers include vacuum compatible monomers, oligomers or low MW polymers and combinations thereof. Vacuum compatible monomers, oligomers or low MW polymers should have high enough vapor pressure to evaporate rapidly in the evaporator without undergoing thermal degradation or polymerization, and at the same time should not have a vapor pressure so high as to overwhelm the vacuum system. The ease of evaporation depends on the molecular weight and the intermolecular forces between the monomers, oligomers or polymers. Typically, vacuum compatible monomers, oligomers and low MW polymers useful in this invention can have weight average molecular weights up to approximately 1200. Vacuum compatible monomers used in this invention are preferably radiation polymerizable, either alone or with the aid of a photoinitiator, and include acrylate monomers functionalized with hydroxyl, ether, carboxylic acid, sulfonic acid, ester, amine and other functionalities. The coating material may be a hydrophobic compound or composition. The coating material may be a crosslinkable, hydrophobic and oleophobic fluorinated acrylate polymer or oligomer, according to one preferred embodiment of the invention. Vacuum compatible oligomers or low molecular weight polymers include diacrylates, triacrylates and higher molecular weight acrylates functionalized as described above, aliphatic, alicyclic or aromatic oligomers or polymers and fluorinated acrylate oligomers or polymers. Fluorinated acrylates, which exhibit very low intermolecular interactions, useful in this invention can have weight average molecular weights up to approximately 6000. Preferred acrylates have at least one double bond, and preferably at least two double bonds within the molecule, to provide high-speed polymerization. Examples of acrylates that are useful in the coating of the present invention and average molecular weights of the acrylates are described in U.S. Pat. No. 6,083,628 and WO 98/18852.

Metal alloys suitable for forming the metal layer(s) of the composite sheets of the present invention include aluminum/bronze alloys, manganese/bronze alloys, copper/nickel/zinc alloys, copper/nickel alloys, stainless steel, and aluminum/magnesium alloys, and other corrosion-resistant alloys of aluminum, gold, silver, zinc, tin, lead, copper which provide a low emissivity composite sheet. Each alloy layer has a thickness between about 15 nm and 200 nm, or between about 30 nm and 60 nm.

The metal coating of the metallized moisture vapor permeable sheets can be formed from more than one metal layer, wherein the individual metal layers are formed from different metals and can have the same or different thicknesses. The metal coating can comprise more than one adjacent metal layers wherein the adjacent layers can be different metals and/or alloys. The multiple adjacent metal layers are preferably selected from the following list: aluminum, silver, copper, gold, tin, zinc, iron, and their alloys, and aluminum/bronze alloys, manganese/bronze alloys, copper/nickel/zinc alloys, copper/nickel alloys, stainless steel, and aluminum/magnesium alloys. Such combinations of adjacent metal layers provide a high degree of corrosion resistance as well as the desired thermal barrier properties. The total thickness of the individual layers of the metal coatings is between 15 nm and 200 nm.

Methods for forming the metal layer(s) are known in the art and include resistive evaporation, electron beam metal vapor deposition, or sputtering. If the metal coating is too thin, the desired thermal barrier properties will not be achieved. If the metal coating is too thick, it can crack and flake off. Generally it is preferred to use the lowest metal thickness that will provide the desired thermal barrier properties. When the composite sheet of the present invention is used as a house wrap or roof lining, the metal layer reflects infrared radiation or emits little infrared radiation, providing a thermal barrier that reduces energy loss and keeps the building cooler in the summer and warmer in the winter.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. Each alloy layer and adjacent outer organic coating layer is preferably deposited sequentially under vacuum without exposure to air or oxygen so that there is no substantial oxidation of the alloy layer. An outer organic coating layer also protects the alloy from mechanical abrasion during roll handling, transportation and end-use installation.

The thermal barrier properties of the composite sheet can also be expressed by the thermal resistance ("R-value") which is a measure of a material's ability to resist heat flow. R-value can be calculated from the emissivity of the sheet. The higher the R-value, the lower the conductance of heat through the sheet. The R-value of the composite sheet of the invention is advantageously greater than 1.6, even greater than 1.8, greater than 2.0.

The metallized moisture vapor permeable sheet of the invention has been found to maintain its thermal barrier properties despite exposure to steam at 90° C. per the Steam Test. When the metallized moisture vapor permeable sheet is exposed to steam until signs of discoloration appear on the surface, the emissivity increases less than 10%. The metallized moisture vapor permeable sheet can withstand exposure to steam at 90° C. for at least 30 minutes, even for at least 90 minutes, and even for at least 120 minutes, before signs of discoloration appear on the surface, demonstrating that the metallized moisture vapor permeable sheet has improved durability for use in corrosive environments.

An apparatus and process suitable for vapor-deposition coating of a sheet layer with organic and metal layers under vacuum is described in U.S. Ser. No. 10/924,218, the parent case of the present application, which is incorporated herein by reference in its entirety.

The metallized moisture vapor permeable sheets of the present invention are especially suitable for use in roof and wall systems in building construction. The highly reflective metallized surface of the metallized moisture vapor permeable sheet provides a low emissivity surface that enhances the performance of the insulation and improves the energy efficiency of wall and roof systems, thus reducing fuel costs for the building owner. Additional benefits include minimization of condensation inside wall and roof structures in cold climates and shielding of the building from excessive heat during the summer months. In one embodiment of the present invention, the metallized moisture vapor permeable sheet is used in a wall or roof system and has an emissivity of no greater than about 0.40 (or no greater than about 0.30, or even no greater than about 0.25), a moisture vapor permeability of at least about 600 g/m$^2$/24 hr, and a hydrostatic head of at least about 100 cm. The metallized moisture vapor permeable sheet is preferably installed in a wall or roof system such that the metallized side is adjacent to an air space. Alternately, the side opposite the metallized side can be adjacent an air space. The distance between the metallized moisture vapor permeable sheet and the second surface that forms the air space therebetween is preferably at least about 0.75 inch (1.9 cm). It is believed that installing the metallized moisture vapor permeable sheet adjacent an air space maximizes the effectiveness of the metallized moisture vapor permeable sheet as a thermal barrier by allowing it to emit little radiant energy or to reflect radiant energy. If the metallized side is in intimate contact over large areas with solid components of the building construction, the energy may be transferred through the building components by conduction, and the effectiveness of the metallized sheet will be reduced. In pitched roof constructions, installing the metallized moisture vapor permeable sheet such that the metallized side faces down, towards the attic space also minimizes any reduction in thermal barrier properties that can occur by dust, dirt, etc. accumulation.

In addition to functioning as a thermal barrier, the metallized moisture vapor permeable sheets of the present invention can shield a building from electromagnetic frequency radiation (EMF) when installed as house wrap and/or roof lining. The metallized moisture vapor permeable sheet attenuates the incoming and/or outgoing EMF signals so that they cannot be transmitted in or out of the building. While aluminum foil or other metallic sheets could be used, such sheets are not breathable which makes them undesirable as building wraps. Standard house wrap and roof lining installation methods can be used to achieve the benefit of EMF shielding. For the most complete protection, the metallized moisture vapor permeable sheet should be installed as a wrap in all the walls and the roof.

Test Methods

In the non-limiting Examples that follow, the following test methods were employed to determine various reported characteristics and properties. ASTM refers to the American Society of Testing Materials. ISO refers to the International Standards Organization. TAPPI refers to Technical Association of Pulp and Paper Industry.

For Examples using sheet layers in roll form, three samples were taken from the beginning, middle, and end of each roll and multiple measurements made on each of these samples and averaged for hydrostatic head, Gurley Hill Porosity, MVTR, and emissivity measurements.

Basis weight (BW) was determined by ASTM D-3776, which is hereby incorporated by reference and reported in g/m$^2$.

Hydrostatic head (HH) was measured using ISO 811, which is hereby incorporated by reference and is reported in cm of water. This test measures the resistance of a sheet to the penetration of liquid water under a static load. A 100 cm$^2$ sample is mounted in a Shirley Hydrostatic Head Tester (manufactured by Shirley Developments Limited, Stockport, England). Water is pumped against one side of the sample until three points of leakage appear on the surface. The hydrostatic head was measured for a total of 18 samples for each Example and the measurements averaged to obtain the average HH reported in the Examples.

Gurley Hill Porosity is a measure of the barrier of the sheet material for gases. In particular, it is a measure of how long it takes for a volume of gas to pass through an area of material wherein a certain pressure gradient exists. Gurley-Hill porosity is measured in accordance with TAPPI T-460 om-88 using a Lorentzen & Wettre Model 121D Densometer. This test measures the time of which 100 cubic centimeters of air is pushed through a 2.54 cm diameter sample under a pressure of approximately 12.45 cm of water. The result is expressed in seconds and is usually referred to as Gurley Seconds. The Gurley Hill Porosity was measured for a total of 18 samples for each Example and the measurements averaged to obtain the average Gurley Seconds reported in the Examples.

Emissivity is a measure of the heat absorbance and reflectance properties of a material and was measured according to ASTM C1371-98 and ASTM C408-71 using a Model AE D&S Emissometer (manufactured by Devices and Services Company, Dallas, Tex.) with the metallized side of the sheet samples facing the radiation source. The detector was heated to 82° C. and calibrated with standards having a low emissivity (reflective, emissivity=0.07) and high emissivity (absorbing, emissivity=0.89). The instrument was calibrated at the beginning and end of each measurement and at least once every 30 minutes. Emissivity measurements were obtained from each of five areas on each sample, one at each corner 0.5 in from the edge and one at the center of the sample. The five measurements were averaged to obtain the average emissivity reported in the Examples.

Thermal Resistance (R-value) is a measure of heat flow through an air cavity and is calculated from the emissivity according to the Fundamentals, part 24.3 of the 1997 ASHRAE® Handbook and reported in units of ° F.-ft$^2$-hr/ BTU.

In the Examples, R-value is calculated for a brick wall with a 0.75 in air space assuming a mean temperature of 50° F., a temperature difference of 30° F. (as specified by "R-value Rule," 16 C.F.R. Part 460) and an emissivity of the other side of 0.9.

Moisture Vapor Transmission Rate (MVTR) is a measure of the moisture vapor permeability of a material and was measured according to ASTM F1249, which is hereby incorporated by reference, under the conditions of 23° C. and 85% Relative Humidity, and is reported in units of g/m$^2$/24 hr. The MVTR was measured for a total of 9 samples for each Example and the measurements averaged to obtain the average MVTR reported in the Examples.

Tensile strength of a sheet layer is measured according to ASTM D5035-90.

The thickness of vapor deposited organic layers was measured on cryomicrotomed specimens using transmission electron microscopy and is reported in micrometers (μm).

Steam Test subjects metallized sheet samples to steam and visually assesses the degree of corrosion over time to approximate accelerated aging. A metallized sample is taped on a piece of glass covering a container of water at a temperature of 90° C., the sample at about 2.5 cm from the surface of the water with the metallized side of the sample facing the water. Water condenses on the metallized surface of the sample, which is visually examined until signs of gray or dark gray discolorations appear, at which time the sample is considered "failed" and the time to failure is recorded. If no discolorations appear, the time is recorded and the sample is considered passed for at least that amount of time. Visual examination is made at least once every minute.

EXAMPLES

Substrate samples were metallized by RF magnetron sputtering using a Materials Research Corporation (Orangeburg, N.J.) model MRC 8667 sputtering system. Sputtering target metals are described in Table 1, below. Each sample 10 to be metallized by sputtering was held at a distance of 3 inches (6.45 cm) from a 6.5 inch (16.5 cm) diameter alloy target within a vacuum chamber 20 evacuated to a pressure below 10$^{-6}$ Torr. The chamber was filled with argon gas to a pressure 10$^{-2}$ Torr and a plasma was generated by an RF power of 200-300 W, which resulted in a target voltage of between −120 V and −200 V. A magnetron 30 was used to intensify the plasma close to the target 40 which was held at a negative potential in order to improve the sputtering efficiency. Prior to rotating the sample under the target for deposition, sputtering of the target for a few minutes was conducted to ensure a fresh surface of the target free of surface contamination and surface oxidation. In order to prevent heating that could affect the samples and to improve the metallization efficiency, the samples were placed in contact with a water-cooled table 50 which was rotated during sputtering. The substrates were only coated as they passed directly opposite the target. The coating thickness was controlled by the number of table revolutions after having determined, using profilometry, the thickness of the deposited alloy layer per revolution on a flat silicon wafer.

TABLE 1

Sputter Target Metals

| Metal/Alloy | Composition | Emissivity (ε) |
| --- | --- | --- |
| Al | 99.99% Al | 0.05 |
| Al/Bronze | 89.8% Cu, 7.47 Al, 2.36 Fe, 0.04 Mn, 0.003 P | 0.07 |
| Mn/Bronze | 57% Cu, 40.0 Zn, 1.5 Mn, 0.75 Fe, 0.75 Sn | Not available |
| Ni Silver* | 65% Cu, 18 Ni, 17 Zn | 0.11 |
| Cu/Nickel (70/30) | 70% Cu, 30 Ni | 0.11 |
| Cu/Nickel (90/10) | 90% Cu, 10 Ni | 0.10 |
| Monel ® 400 | 63% Ni min, 28-34 Cu, 2.5 Fe, 2.0 Mn, 0.5 Si, 0.3 C | 0.14 |
| Monel ® K-500 | 64.15% Ni, 30 Cu, 3.0 Al, 1.5 Mn, 0.5 Si, 0.5 Ti, 0.25 C, 0.1 S | 0.12 |
| Stainless steel SS 304 | 66.92% Fe, 19.0 Cr, 11.0 Ni, 2.0 Mn, 1.0 Si, 0.08 C | 0.14 |
| Stainless steel SS 316 | 57.83% Fe, 16.8 Cr, 11.1 Ni, 2.4 Mo, 1.9 Mn, 0.9 Si, 0.07 C | 0.28 |
| Al—Mg 5052 & 5086 | 95% Al, 4% Mg, 0.45% Mn, 0.15% Cr | Not available |

*Note that the alloy referred to as "nickel silver" is made from copper, nickel and zinc, and contains no silver.

Examples 1-22

The following substrate samples were metallized as set forth in Table 2, below.

DuPont™ Tyvek® spunbond high density polyethylene, style 1560B available from E.I. du Pont de Nemours & Co., Wilmington, Del. (Tyvek® 1560B);

DuPont™ Tyvek® spunbond high density polyethylene, style 1055B available from E.I. du Pont de Nemours & Co., Wilmington, Del. (Tyvek® 1055B);

Styrofoam™ Weathermate™ Plus polyolefin-based nonwoven housewrap available from The Dow Chemical Company, Midland, Mich. (Weathermate™ Plus);

PermaWrap Gold™ polypropylene fabric available from Perma "R" Products, Johnson City, Tenn. (PermaWrap Gold™);

Typar® Weather Protection Membrane spunbonded polypropylene-microporous film laminate available from Fiberweb, London, UK (Typar®);

Pinkwrap® woven polypropylene sheet with a perforated coating available from Owens Corning, Corning, N.Y. (Pinkwrap®);

Air-Guard® Buildingwrap woven HDPE slit film coated with a white pigmented PE film on one side and perforated available from Fabrene, Inc. North Bay, Ontario (Air-Guard®);

FirstWrap™ woven polypropylene fabric available from Firstline Corporation, Valdosta, Ga. (FirstWrap™); and 60 minute Grade D building paper available from GAF Leatherback Industries, Hollister, Calif. (60 minute building paper).

Two Tyvek® control samples were tested for comparison against Examples 1-22, one without a metal coating and one with only an aluminum coating.

It was observed that samples having relatively smooth surfaces had lower emissivities and higher R-values. The alloys which performed best overall in terms of emissivity and performance after exposure to steam in the Steam Test were the Monel® alloys (Monel® is a trademark of Special Metals Corp.), stainless steel and nickel silver. The Monel® and stainless steel samples showed no steam corrosion after five hours of exposure to steam. In additional testing, it was observed that emissivity decreased as alloy thickness increased from 25 to 80 nm.

Alloys containing Cu, Ni and Zn changed from shiny "silver" to "gold" color after exposure to steam indicating changes in the surface composition and likely oxidation of Cu and/or Ni. For example, samples having a alloy layer of nickel silver changed from a shiny silver color to a yellow copper color; however these samples did not lose good emissivity after 2.5 hours of exposure to steam. Some alloys showed an increase in emissivity indicating some alloy corrosion as a result of exposure to steam.

The substrates other than Tyvek® were also metallized with aluminum (no additional organic coating). The emissivi-

TABLE 2

| Ex. No. | Substrate | Metal Layer | Metal Layer Thickness, nm | ε of Metallized Substrate | R-value (° F.-ft²-hr/BTU) | Metal Layer Appearance, including change due to Steam Test | Δε as a result of Steam Test (%) | Time to discoloration due to Steam Test (min) |
|---|---|---|---|---|---|---|---|---|
| Control | Tyvek® 1560B | n/a | n/a | 0.60 | 1.2 | n/a | n/a | n/a |
| Control | Tyvek® 1560B | Al | 88 | 0.15 | 2.3 | Shiny silver | 114 | Failed at 15 min |
| 1 | Tyvek® 1560B | Monel® K-500 | 80 | 0.30 | 1.8 | Shiny silver | 3 | Passed 300 min |
| 2 | Tyvek® 1560B | Monel® 400 | 80 | 0.26 | 1.9 | Shiny silver | 7 | Passed 300 min |
| 3 | Tyvek® 1560B | Cu—Ni (90/10) | 80 | 0.21 | 2.0 | Shiny silver before, shiny gold after Steam Test | 86 | Failed at 30 min |
| 4 | Tyvek® 1560B | Cu—Ni (70/30) | 80 | 0.26 | 1.9 | Shiny silver before, shiny gold after Steam Test | 27 | Failed at 120 min |
| 5 | Tyvek® 1560B | Ni Silver | 40 | 0.30 | 1.8 | Shiny silver before, shiny gold after Steam Test | 21 | Passed 150 min |
| 6 | Tyvek® 1560B | Ni Silver | 80 | 0.23 | 2.0 | Shiny silver before, shiny gold after Steam Test | 4 | Passed 150 min |
| 7 | Tyvek® 1560B | Al Bronze | 80 | 0.22 | 2.0 | Shiny silver before, shiny gold after Steam Test | 46 | Failed at 90 min |
| 8 | Tyvek® 1560B | SS304 | 80 | 0.34 | 1.7 | Shiny silver | 3 | Passed 300 min |
| 9 | Weathermate™ Plus | Monel® 400 | 80 | 0.21 | 2.0 | Shiny silver | Not available | Passed 90 min |
| 10 | PermaWrap Gold™ | Monel® 400 | 80 | 0.20 | 2.0 | Shiny silver | Not available | Passed 90 min |
| 11 | Typar® | Monel® 400 | 80 | 0.29 | 1.8 | Shiny silver | Not available | Passed 90 min |
| 12 | Pinkwrap® | Monel® 400 | 80 | 0.18 | 2.1 | Shiny silver | Not available | Passed 90 min |
| 13 | Air-Guard® | Monel® 400 | 80 | 0.23 | 2.0 | Shiny silver | Not available | Passed 90 min |
| 14 | FirstWrap™ | Monel® 400 | 80 | 0.17 | 2.2 | Shiny silver | Not available | Passed 90 min |
| 15 | 60 minute building paper | Monel® 400 | 80 | 0.35 | 1.7 | Shiny silver | Not available | Passed 90 min |
| 16 | Weathermate™ Plus | SS 304 | 80 | 0.31 | 1.8 | Shiny silver | Not available | Passed 90 min |
| 17 | PermaWrap Gold™ | SS 304 | 80 | 0.25 | 1.9 | Shiny silver | Not available | Passed 90 min |
| 18 | Typar® | SS 304 | 80 | 0.38 | 1.6 | Shiny silver | Not available | Passed 90 min |
| 19 | Pinkwrap® | SS 304 | 80 | 0.31 | 1.8 | Shiny silver | Not available | Passed 90 min |
| 20 | Air-Guard® | SS 304 | 80 | 0.29 | 1.8 | Shiny silver | Not available | Passed 90 min |
| 21 | FirstWrap™ | SS 304 | 80 | 0.23 | 2.0 | Shiny silver | Not available | Passed 90 min |
| 22 | 60 minute building paper | SS 304 | 80 | 0.57* | 1.3 | Shiny silver | Not available | Passed 90 min |

*High emissivity for this sample was attributed to poor alloy coverage.

ties of the metallized samples range from 0.05 to 0.30 depending on the roughness of the surface which was metallized. Each of these metallized samples failed the Steam Test within less than 15 minutes.

The substrates other than Tyvek® were only exposed to steam in the Steam Test for 90 minutes, but it is expected that they would have performed equally well as did the Tyvek® samples having Monel® 400 and SS 304 alloy layers at extended steam exposure times.

In order to determine whether the physical properties of the nonwovens samples were affected by the alloy layer, basis weight, MVTR and HH were measured for the samples without the alloy layer as well as for metallized samples (no additional organic coating). The properties of the starting sheet samples were found to be within the ranges listed in Table 3. The corresponding properties of the metallized samples were found to be essentially unchanged by the alloy layer.

TABLE 3

| Substrate | Basis Weight (g/m$^2$) | MVTR (g/m$^2$/24 hr) | HH (cm H$_2$O) |
|---|---|---|---|
| Tyvek ® 1560B | 55.5-60.5 | 1100-1650 | 160-210 |
| Tyvek ® 1055B | 57.3-65.4 | 800-1910 | 140-355 |

Accordingly, the data in Tables 2 and 3 demonstrate that highly effective and durable thermal barrier sheets can be made by depositing extremely thin metal alloy coatings on various porous, moisture vapor permeable sheets, without significantly affecting their moisture vapor permeabilities and liquid barrier properties. The metallized, moisture vapor permeable sheets of the present invention should find high value in building constructions.

What is claimed is:

1. A metallized, moisture vapor permeable sheet consisting of:
 a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics;
 at least one metal coating on said first outer surface of the sheet layer which substantially covers the outer surfaces of the porous sheet while leaving the pores substantially uncovered, said metal coating comprising an alloy selected from the group consisting of aluminum/bronze alloys, manganese/bronze alloys, copper/nickel/zinc alloys, copper/nickel alloys, stainless steel, and aluminum/magnesium alloys, having a thickness between about 15 nanometers and about 200 nanometers adjacent the first outer surface of the sheet layer; and
 an intermediate organic coating layer selected from the group consisting of polymers, oligomers or combinations thereof, having a thickness between about 0.02 micrometer and 0.6 micrometers disposed between said first outer surface of the sheet layer and said metal coating wherein the intermediate organic coating layer is vapor deposited on said first outer surface of the sheet layer.

2. The metallized, moisture vapor permeable sheet of claim 1, wherein the MVTR of the sheet is at least about 80% of the MVTR of the sheet layer measured prior to depositing the metal coating, the thermal resistance (R-value) is at least 1.6° F.-ft$^2$-hr/BTU, and the time of exposure to steam at 90° C. until signs of gray or dark gray discolorations appear on the surface of the metallized sheet is at least 30 minutes.

3. The metallized, moisture vapor permeable sheet of claim 1, wherein the metal coating comprises two or more different metal layers, one of which metal layers is said alloy, and the remaining metal layer(s) being selected from the group consisting of aluminum, silver, copper, gold, tin, zinc, iron, aluminum/bronze alloys, manganese/bronze alloys, copper/nickel/zinc alloys, copper/nickel alloys, stainless steel, and aluminum/magnesium alloys.

4. The metallized, moisture vapor permeable sheet of claim 1, further comprising a second metal coating deposited on the second outer surface of the moisture vapor permeable sheet layer.

5. The metallized, moisture vapor permeable sheet of claim 1, wherein the porous sheet is a nonwoven fabric selected from the group consisting of spunbond fabrics, meltblown fabrics, flash spun plexifilamentary sheets, carded-webs, air-laid webs, spunlaced webs and composites thereof.

6. A metallized, moisture vapor permeable sheet consisting of:
 a moisture vapor permeable sheet layer having first and second outer surfaces, the sheet layer comprising at least one of a nonwoven fabric, woven fabric, nonwoven fabric-film laminate, woven fabric-film laminate, moisture vapor permeable film and composites thereof, wherein the first outer surface of the moisture vapor permeable sheet layer is a porous sheet selected from the group consisting of microperforated films, woven fabrics and nonwoven fabrics;
 a metal coating on said first outer surface of the sheet layer, the metal coating comprising two or more different metal layers selected from the group consisting of aluminum, silver, copper, gold, tin, zinc, iron, aluminum/bronze alloys, manganese/bronze alloys, copper/nickel/zinc alloys, copper/nickel alloys, stainless steel, and aluminum/magnesium alloys, the metal coating having a thickness between about 15 nanometers and 200 nanometers adjacent the first outer surface of the sheet layer; and
 an intermediate organic coating layer selected from the group consisting of polymers, oligomers or combinations thereof, having a thickness between about 0.02 micrometer and 0.6 micrometers disposed between said first outer surface of the sheet layer and said metal coating wherein the intermediate organic coating layer is vapor deposited on said first outer surface of the sheet layer.

7. The metallized, moisture vapor permeable sheet of claim 6, wherein the MVTR of the sheet is at least about 80% of the MVTR of the sheet layer measured prior to depositing the metal coating, the thermal resistance (R-value) is at least 1.6° F.-ft$^2$-hr/BTU, and the time of exposure to steam at 90° C. until signs of gray or dark gray discolorations appear on the surface of the metallized sheet is at least 30 minutes.

8. The metallized, moisture vapor permeable sheet of claim 6, wherein at least one of said metal layers is an alloy selected from the group consisting of aluminum/bronze alloys, manganese/bronze alloys, copper/nickel/zinc alloys, copper/nickel alloys, stainless steel, and aluminum/magnesium alloys.

9. The metallized, moisture vapor permeable sheet of claim 6, further comprising a second metal coating deposited on the second outer surface of the moisture vapor permeable sheet layer.

10. The metallized, moisture vapor permeable sheet of claim 6, wherein the porous sheet is a nonwoven fabric selected from the group consisting of spunbond fabrics, meltblown fabrics, flash spun plexifilamentary sheets, carded-webs, air-laid webs, spunlaced webs and composites thereof.

11. A metallized, moisture vapor permeable sheet consisting of:
- a porous flash spun plexifilamentary sheet layer having first and second outer surfaces;
- at least one metal coating having a thickness between about 15 nanometers and 200 nanometers deposited on the first outer surface of the flash spun plexifilamentary sheet layer, said metal selected from the group consisting of aluminum/bronze alloys, manganese/bronze alloys, copper/nickel/zinc alloys, copper/nickel alloys, stainless steel, and aluminum/magnesium alloys; and
- an intermediate organic coating layer of a composition containing a cross-linked polyacrylate having a thickness between about 0.02 micrometer and 0.6 micrometers disposed between said first outer surface of the sheet layer and said metal coating wherein the intermediate organic coating layer is vapor deposited on said first outer surface of the sheet layer;
- wherein the metal coating substantially covers the outer surface of the flash spun plexifilamentary sheet while leaving the pores substantially uncovered.

12. The metallized, moisture vapor permeable sheet of claim 1, wherein the intermediate organic coating layer has a thickness between about 0.02 micrometers and 0.2 micrometers.

13. The metallized, moisture vapor permeable sheet of claim 6, wherein the intermediate organic coating layer has a thickness between about 0.02 micrometers and 0.2 micrometers.

14. The metallized, moisture vapor permeable sheet of claim 11, wherein the intermediate organic coating layer has a thickness between about 0.02 micrometers and 0.2 micrometers.

* * * * *